United States Patent [19]
Simizu

[11] Patent Number: 6,066,855
[45] Date of Patent: May 23, 2000

[54] CHARGED-PARTICLE-BEAM OPTICAL SYSTEM EXHIBITING ABERRATION CORRECTION

[75] Inventor: Hiroyasu Simizu, Kawasaki, Japan

[73] Assignee: Nikon Corporation, Tokyo, Japan

[21] Appl. No.: 09/168,187

[22] Filed: Oct. 7, 1998

[30] Foreign Application Priority Data

Oct. 7, 1997 [JP] Japan ................................. 9-274739

[51] Int. Cl.$^7$ ................................................. H01J 37/14
[52] U.S. Cl. .................................. 250/492.22; 250/396 R
[58] Field of Search ........................ 250/492.22, 492.23, 250/396 R, 398

[56] References Cited

U.S. PATENT DOCUMENTS 5,708,274  1/1998  Langher et al. ................... 250/396 R

*Primary Examiner*—Kiet T. Nguyen
*Attorney, Agent, or Firm*—Klarquist Sparkman Campbell Leigh & Whinston, LLP

[57] ABSTRACT

Charged-particle-beam optical systems are disclosed that are usable in projection-exposure apparatus employing a charged particle beam for projecting an image of an object (e.g., region of a lithographic mask) onto a sample (e.g., semiconductor wafer). Such an optical system comprises a deflection system for deflecting a trajectory of the charged particle beam such that a second-order derivative of the deflected trajectory is substantially constant in an object-side region extending from an object point to a crossover image point, and substantially constant in an image-side region extending from the crossover image point to an image point.

29 Claims, 3 Drawing Sheets

$Z_O$ Object position
$Z_i$ Image position
$Z_{CO}$ Crossover image position
$W_m$ Deflection trajectory $Z_O$ Object position
$Z_i$ Image position
$Z_{CO}$ Crossover image position
$W_m$ Deflection trajectory $Z_O$ Object position
$Z_i$ Image position
$Z_{CO}$ Crossover image position
$W_m$ Deflection trajectory

- $Z_O$ Object position
- $Z_i$ Image position
- $Z_{CO}$ Crossover image position
- $W_m$ Deflection trajectory

- $Z_O$ Object position
- $Z_i$ Image position
- $Z_{CO}$ Crossover image position
- $W_m$ Deflection trajectory

- $Z_O$ Object position
- $Z_i$ Image position
- $Z_{CO}$ Crossover image position
- $W_m$ Deflection trajectory

CHARGED-PARTICLE-BEAM OPTICAL SYSTEM EXHIBITING ABERRATION CORRECTION

FIELD OF THE INVENTION

This invention relates to apparatus for projection microlithography using a charged particle beam, as employed in the manufacture of semiconductor integrated circuits, for example. More specifically, the invention is directed to charged-particle-beam optical systems as used in such apparatus.

BACKGROUND OF THE INVENTION

A conventional projection-exposure apparatus employing an electron beam is schematically depicted in FIG. 3. Such an apparatus is used to transfer a pattern, defined on a reticle or mask (hereinafter simply referred to as a "mask") 1 onto a photosensitive substrate 5 (e.g., semiconductor wafer). The various components of the FIG. 3 apparatus are arranged along an optical axis AX.

The electron beam EB is emitted from an electron gun (not shown, but understood to be located just upstream of a crossover CO1 at which an image of the electron gun is formed). The electron beam EB is converged by an illumination lens 50 and deflected by deflectors 51 onto a subfield 1a of the mask 1. Because the mask 1 comprises multiple individual subfields 1a each defining a respective portion of the pattern, the mask is termed a "segmented" mask.

The electron beam EB illuminating the subfield 1a typically has a square or rectangular transverse profile, and includes an on-axis component EB1, and off-axis components represented by components EB2, EB3. The on-axis component EB1 strikes the center of the subfield 1a, while the representative off-axis components EB2, EB3 are directed to the left and right portions, respectively, of the subfield 1a in the figure. The bold line in the middle of the on-axis component EB1 indicates the general trajectory of the electron beam irradiating the subfield 1a.

The electron beam EB, after having passed through the subfield 1a of the mask 1, is focused on the photosensitive substrate 5 by first and second projection lenses 3, 4, respectively. The projection lenses 3, 4 form an image of the subfield 1a on a corresponding area of the photosensitive substrate 5.

The apparatus shown in FIG. 3 is termed a "VAL" (Variable Axis Lens) system that includes VAL deflectors 31, 32, 33, 34 and VAL focus-correction lenses 35, 36, 37, 38. Energizing any of the VAL deflectors 31–34 generates a corresponding magnetic field having a magnitude proportional to $a(dB(Z)/dZ)$; similarly, energizing any of the VAL focus-correction lenses 35–38 generates a corresponding magnetic field having a magnitude proportional to $a^2(d^2B/dZ^2)$, wherein $B(Z)$ is the magnetic flux distribution of the on-axis magnetic field generated by the respective projection lenses 3, 4, and "a" is the lateral deflection of the electron beam EB imparted by the deflectors 51 (i.e., the lateral distance from the optical axis AX to the center of the sub-field 1a). Thus, the magnetic field generated by the projection lenses 3, 4 (the field normally extending along the optical axis AX) is laterally shifted to the deflected trajectory axis (i.e., the trajectory of the electron beam EB laterally offset from the optical axis AX). Because the deflected trajectory axis equivalently traces along the common axis of the projection lenses 3, 4, the aberration exhibited by the projection lenses 3, 4 with respect to a laterally shifted beam is substantially the same as when the electron beam is propagating on-axis. Such an arrangement reportedly reduces lens aberrations compared to a lens arrangement lacking VAL deflectors 31–34 and VAL focus-correction lenses 35–38.

Further with respect to the FIG. 3 apparatus, a deflector 41 deflects the electron beam EB toward the optical axis AX to direct the beam EB to an aperture 6 positioned at a second crossover CO2 located between the mask 1 and the substrate 5. A deflector 42 further deflects the electron beam EB, that has passed through the aperture 6, such that the trajectory of the electron beam EB becomes parallel to the optical axis. The electron beam EB then strikes the substrate 5 at a normal angle relative to the surface of the substrate.

The mask 1 is movably supported by a mask stage MS and the substrate 5 is movably supported by a wafer stage WS. During exposure of the substrate 5 with the mask pattern, the mask stage MS and wafer stage WS are continuously moved in opposite directions relative to each other (e.g., opposite directions perpendicular to the plane of the page). Meanwhile, the electron beam EB is deflected in a direction perpendicular to the movement directions of the stages MS, WS (e.g., in horizontal directions parallel to the plane of the page) for each subfield 1a. While moving the mask stage MS and wafer stage WS in such a manner, the pattern portions in the subfields of the mask 1 are successively transferred onto the corresponding areas of the substrate 5, ultimately forming the entire mask pattern on the substrate 5.

The greater the width of each subfield (i.e., the left-to-right dimension of each subfield 1a shown in FIG. 3), the fewer subfields required to fully define the mask pattern, the fewer subfields that need to be illuminated by the electron beam EB, and the fewer back-and-forth motions of the stages MS, WS required to reproduce the entire mask pattern on the substrate. Hence, larger subfields can result in a shorter amount of time needed for each exposure of a complete mask pattern on the substrate 5 (termed greater "throughput" in the art).

However, according to the scheme shown in FIG. 3, certain subfields 1a will be located remotely from the optical axis AX. If such a distant subfield is irradiated and projected onto the substrate 5, deflection aberrations caused by the deflectors 41, 42 can be unacceptably large despite whatever contributions the VAL system makes to reducing aberrations in the projection lenses 3, 4. The increased aberration is proportional to the magnitude of lateral deflection imparted by the deflectors 41, 42.

Therefore, the greater the lateral deflection of the electron beam EB imparted by the deflector 51, the greater the image blur due to deflection aberrations. Consequently, the desired resolution for pattern transfer cannot be achieved using such a conventional apparatus.

SUMMARY OF THE INVENTION

According to the foregoing, an object of the invention is to provide charged-particle-beam (CPB) optical systems, and pattern-transfer apparatus comprising such optical systems, capable of maintaining aberrations to an acceptably low level if the trajectory of the charged particle beam is greatly deflected in a lateral direction from the optical axis.

The foregoing object is achieved by apparatus and methods according to the present invention. According to a first aspect of the invention, charged-particle-beam optical systems are provided for projecting an image of an object (e.g., a lithographic mask, situated at an object position) onto a sample (e.g., a lithographic substrate, situated at an image position). A preferred embodiment of such a system comprises first and second projection lenses, and a deflector system. The first and second projection lenses project an image of the object onto the sample using a charged particle beam propagating along a trajectory through the first and second projection lenses. The deflector system is configured and situated so as to deflect the trajectory of the charged particle beam such that a second-order derivative of the deflected trajectory is substantially constant through most (i.e., more than half, more preferably at least three-fourths) of an object-side region extending from the object position to a crossover image point located between the object position and the image position, and substantially constant through most (i.e., more than half, more preferably at least three-fourths) of an image-side region extending from the crossover image point to the image position.

The deflector system preferably comprises multiple deflectors arranged relative to the first and second projection lenses. The deflector system preferably generates a deflection field satisfying an SMD condition. Further preferably, the deflector system generates x- and y-direction deflection fields, in the object-side region, that are respectively expressed by $$W_{mo}\left[-k(z-z_o)B(z) + \frac{1}{2}\left(1 - \frac{1}{2}k(z-z_o)^2\right)\frac{dB(z)}{dz}\right]$$

and $$-W_{mo} \cdot k\sqrt{2m\phi/e}$$

The deflector system also preferably generates x- and y-direction deflection fields, in the image-side region, that are respectively expressed by $$M \cdot W_{mo}\left[-k(z-z_i)B(z) + \frac{1}{2}\left(1 - \frac{1}{2}k(z-z_i)^2\right)\frac{dB(z)}{dz}\right]$$

and $$-M(W_{mo})k\sqrt{2m\phi/e}$$

In the foregoing expressions, $z_o$, $z_i$, and $Z_{co}$ are z coordinates of the object point, the image point, and the crossover image point, respectively; e is the electric charge of a charged particle in the charged particle beam; m is the mass of the charged particle; $W_{mo}$ is the magnitude of deflection from the optical axis at the object point; $\phi$ is the acceleration voltage of the charged particle; B(Z) is the on-axis magnetic field distribution generated by the first and second projection lenses; M is the deflection magnification of the image relative to the object as projected by the projection lenses; and k is a constant.

The second-order derivative of the deflected trajectory through the object-side region is preferably opposite in sign to the second-order derivative of the deflected trajectory through the image-side region. The sign preferably changes at the crossover image point. The beam preferably follows a first parabolic trajectory from the object position to the crossover image point and a second parabolic trajectory from the crossover image point to the image position. Also, the beam preferably follows a parabolic trajectory through the crossover image point. Furthermore, an integral of a function representing the second-order derivative of the deflection trajectory from the object point to the crossover image point is preferably effectively cancelled by an integral of a function representing the second-order derivative of the deflection trajectory from the crossover image point to the image point. The deflection trajectory is also preferably normal to an object plane at the image position and an image plane at the image position.

According to another aspect of the invention, charged-particle-beam projection-exposure apparatus are provided. A preferred embodiment of such an apparatus comprises an illumination lens, first and second projection lenses, and a deflector system. The illumination lens directs a charged particle beam from a source to a mask or reticle. The projection lenses are situated downstream of the mask and are operable to project an image, of a region of the mask illuminated by the charged particle beam, onto a substrate using the charged particle beam propagating along a trajectory through the first and second projection lenses. The mask is situated at an object position, and the substrate is situated at an image position. The deflector system is configured and situated so as to deflect the trajectory of the charged particle beam such that a second-order derivative of the deflected trajectory is substantially constant through most (i.e., at least half, more preferably at least three-fourths) of an object-side region extending from the object position to a crossover image point located between the object position and the image position, and substantially constant through most (i.e., at least half, more preferably at least three-fourths) of an image-side region extending from the crossover image point to the image position.

The deflector system generates x- and y-direction deflection fields, in the object-side region, that are respectively expressed as summarized above. The beam preferably follows a first parabolic trajectory from the object position to the crossover image point and a second parabolic trajectory from the crossover image point to the image position. The second-order derivative of the deflected trajectory over the object-side region is preferably opposite in sign to the second-order derivative of the deflected trajectory over the image-side region.

The charged particle beam is typically an electron beam, but can be any of various other types of particle beams such as an ion beam.

According to another aspect of the invention, methods are provided for projecting an image of an object (e.g., a lithographic mask or reticle) onto a sample (e.g., a lithographic substrate). In a preferred embodiment of the method, a charged particle beam is provided. A region on the object (situated at an object position) is illuminated by the charged particle beam. Portions of the beam transmitted through the illuminated region are passed in a trajectory through first and second projection lenses to a sample situated at an image position. As the charged particle beam passes through the first and second projection lenses, the beam is deflected such that the trajectory of the charged particle beam through most (i.e., at least half, more preferably at least three-fourths) of an object-side region extending from the object position to a crossover image position has a substantially constant second-order derivative, and the trajectory of the charged particle beam through most (i.e., at least half, more preferably at least three-fourths) of an image-side region extending from the crossover image position to the image position has a substantially constant second-order derivative. The second-order derivative of the trajectory through the object-side region is preferably opposite in sign to the second-order derivative of the trajectory through the image-side region. The sign preferably changes at the crossover image point. The beam preferably follows a first parabolic trajectory from the object position to the crossover image point and a second parabolic trajectory from the crossover image point to the image position.

The foregoing and additional features and advantages of the invention will be more readily apparent from the following detailed description, which proceeds with reference to the accompanying drawings.

DETAILED DESCRIPTION

Figure 1:
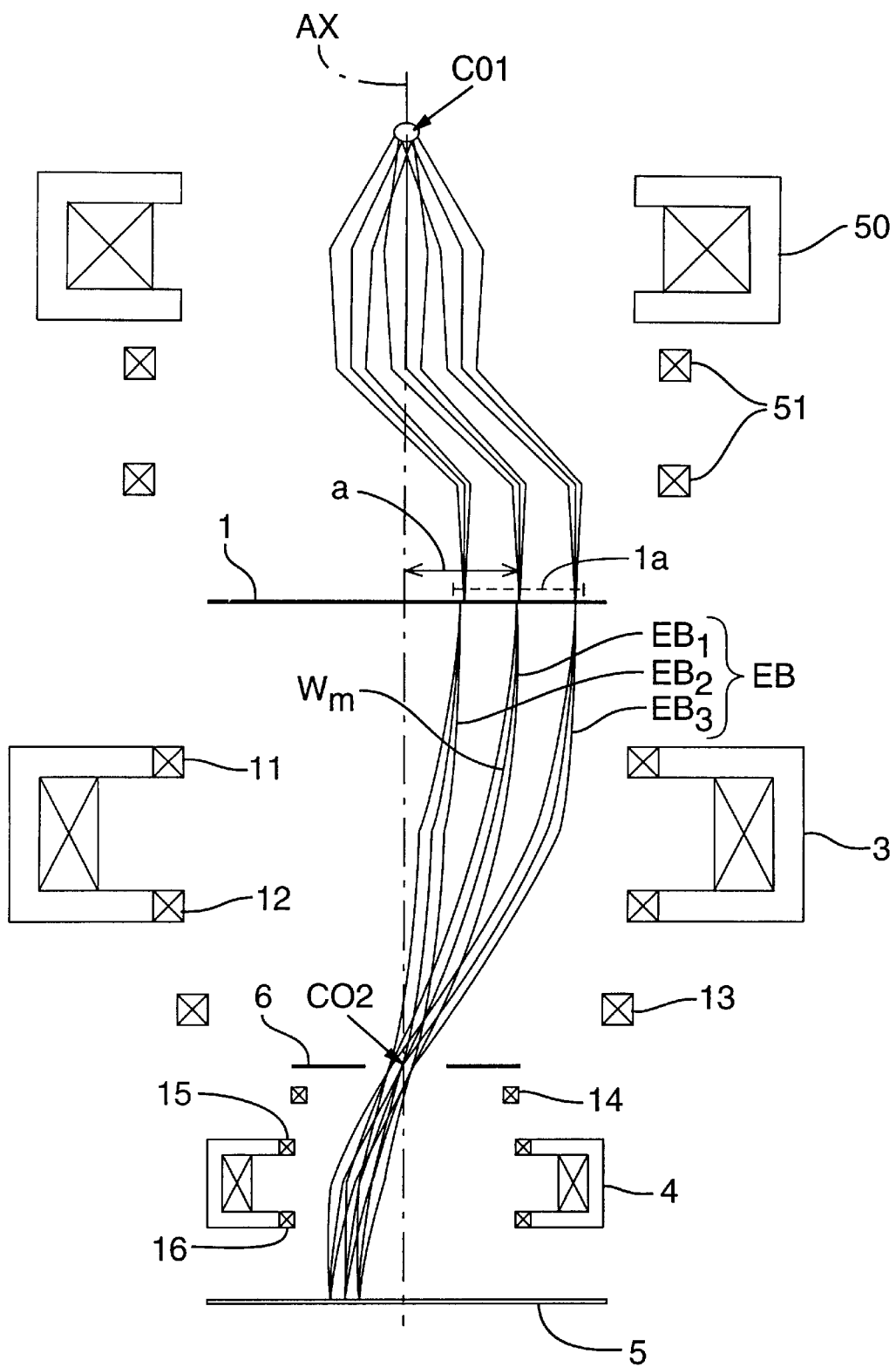
FIG. 1 is a schematic elevational view of a preferred embodiment of a charged-particle-beam projection-transfer apparatus according to the invention.

A preferred embodiment of an apparatus according to the present invention will now be described with reference to FIGS. 1 and 2(a)–2(c).

In general, a charged-particle-beam (CPB) optical system used in a CPB exposure apparatus includes deflectors. Aberrations generated in such CPB optical systems are categorized into two groups. A first group pertains to aberrations that arise independently of deflection, and a second group pertains to aberrations that arise due to deflection (referred to as "deflection aberrations"). The first group of aberrations include on-axis aberrations (such as spherical aberration and on-axis chromatic aberration) and magnification/rotation aberrations (such as coma, astigmatism, chromatic aberration, and distortion, all due to magnification and rotation of the image). The second group of aberrations (deflection aberrations) includes deflection coma, deflection astigmatism, hybrid astigmatism, deflection field curvature, hybrid field curvature, deflection-chromatic aberration, deflection distortion, and hybrid distortion.

Among the deflection aberrations, deflection-chromatic aberration, deflection distortion, and hybrid distortion conventionally are reduced substantially to zero by employing a Symmetric Magnetic Doublet ("SMD") lens in the optical system, and by configuring the deflectors to function cooperatively with the SMD lens. Deflection astigmatism and deflection field curvature conventionally are corrected by dynamic correction of the deflection width using a focus-correction lens or a stigmator.

However, the other three deflection aberrations (i.e., deflection coma, hybrid astigmatism, and hybrid field curvature) cannot be corrected by conventional methods. Because the magnitudes of such aberrations are a function of the deflection trajectory of the beam, the greater the beam deflection from the optical axis AX, the worse such aberrations tend to be.

Certain relationships have now been discovered between the deflection trajectory and deflection coma, hybrid astigmatism, and hybrid field curvature arising in a CPB exposure apparatus. Taking into account only a portion of the aberration integral (which is a function of the deflection trajectory): (1) with respect to deflection coma and hybrid astigmatism, the integrated function in the aberration integral is proportional only to the second-order derivative of the deflection trajectory; and (2) with respect to hybrid field curvature, the integrated function is a linear combination of a term proportional to the second-order derivative of the deflection trajectory and a term proportional to the first-order derivative of the deflection trajectory at the image point and the object point. If deflection coma, hybrid astigmatism, and hybrid field curvature are denoted as $M_{coma}$, $H_{as}$, and $H_{fc}$, respectively, these aberrations are expressed by Equations (1)–(3), respectively.

$$M_{coma} = \int_{z_o}^{z_i} \left( C_{coma} \cdot \frac{d^2 W_m(z)}{dz^2} \right) dz \quad (1)$$

$$H_{as} = \int_{z_o}^{z_i} \left( C_{as} \cdot \frac{d^2 W_m(z)}{dz^2} \right) dz \quad (2)$$

$$H_{fc} = \left[ D_{fc} \cdot \frac{dW_m(z)}{dz} \right]_{z_o}^{z_i} + \int_{z_o}^{z_i} \left( C_{fc} \cdot \frac{d^2 W_m(z)}{dz^2} \right) dz \quad (3)$$

In the foregoing equations, the optical axis is assumed to extend along the Z-axis. The variables $z_o$ and $z_i$ denote the z coordinates of the object point and the image point, respectively; $W_m(Z)$ denotes the deflection trajectory; and $C_{coma}$, $C_{as}$, $C_{fc}$ and $D_{fc}$ are functions of z determined by the lens but not the deflectors.

The aberrations $M_{coma}$, $H_{as}$, and $H_{fc}$ are discussed below in more detail under various trajectory conditions.

Straight Trajectory

A first representative trajectory condition pertains to a straight trajectory, i.e., a straight-line deflection trajectory from the object point to the image point, wherein the line passes through the crossover image point. Under such a condition, the $d^2 W_m(Z)/dZ^2$ term is zero in equations (1)–(3). Accordingly, the deflection coma $M_{coma}$ and hybrid astigmatism $H_{as}$ are zero. However, under such a condition the incident beam is not normal to the object plane or the image plane. Hence, $dW_m(Z)/dZ$ is not zero and, therefore, hybrid field curvature is still present. In general, under such a condition, hybrid field curvature is relatively large compared to other aberrations. This means that, even if other aberrations are reduced to zero or nearly zero, the net aberration of the system is still large.

Because, with a straight trajectory, the beam does not strike the photosensitive substrate 5 at a normal angle, the projected image is prone to shifts due to microscopic surficial irregularities on the photosensitive substrate 5. Under such conditions, the image point must be strictly and accurately determined and controlled.

Normal-Incidence Trajectory

A second representative trajectory condition pertains to a normal-incidence trajectory. Under such a condition, the deflection trajectory is normal to both the object plane and the image plane, and the first-order derivative $dW_m(Z)/dZ$ is zero (e.g., $dW_m(Z)/dZ=0$). Accordingly, the first term of equation (3) for hybrid field curvature $H_{fc}$ is zero. Also, hybrid field curvature $H_{fc}$ is a function only of the second-order derivative of the deflection orbit $W_m$, similar to deflection coma $M_{coma}$ and hybrid astigmatism $H_{as}$.

Optical System Producing Deflection Field Satisfying the SMD Condition

It was found from Equations (1)–(3) that, with an SMD optical system in which the deflection field generated by the deflectors also satisfies SMD conditions, the object-side integral of the hybrid astigmatism and the hybrid field curvature integrated from the object point to the crossover image point cannot be canceled by the image-side integral of the hybrid astigmatism and the hybrid field curvature integrated from the crossover image point to the image point. With respect to deflection coma, the object-side integral is canceled by the image-side integral only if the image magnification is coincident with the deflection magnification and the magnification is unity. Usually, however, pattern projection is performed with demagnification (by which is meant that the image on the substrate is smaller than the corresponding pattern on the reticle, usually by an integer factor); under such conditions, deflection coma is not entirely canceled. Therefore, even if the deflection field satisfies the SMD condition, the overall aberration integral must be reduced on both the object side and the image side.

From the foregoing, the following conclusions were obtained:

(1) If the aberration is simply defined by the second-order derivative of the deflection trajectory $W_m$, then the smaller the first-order derivative of the deflection trajectory at the crossover image point, the fewer aberrations exhibited by the system. With a normal incident beam, the aberration is very small if the straight trajectory is deflected in the vicinity of the object point and the image point.

(2) In Equations (1)–(3), the coefficients $C_{coma}$, $C_{as}$, and $C_{fc}$ individually multiplied by the second-order derivative of the deflection trajectory $W_m$ are not constant with respect to z, but have respective distributions. In addition, the signs of the second-order derivatives of the deflection trajectory $W_m$ in the object-side region and the image-side region are opposite to each other. (The sign changes at the second crossover CO2; the second crossover CO2 is also termed the "crossover image point".) Accordingly, if the second-order derivative of the deflection trajectory $W_m$ can be kept constant, the overall aberration integral can be very small because of cancellation of positive and negative signs of the integral results in the object-side and image-side regions.

Figure 2A:
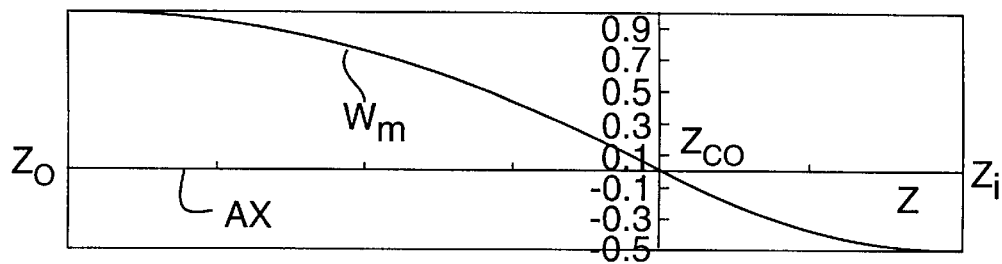
FIG. 2(a) is a plot of a representative deflection trajectory $W_m$ achieved using the FIG. 1 apparatus.

FIG. 2(a) shows a representative plot of a deflection trajectory according to the invention, in which the beam is incident to the object plane ($z_o$) and the image plane ($z_i$) at a normal angle, but follows a parabolic path between these locations.

Figure 3:
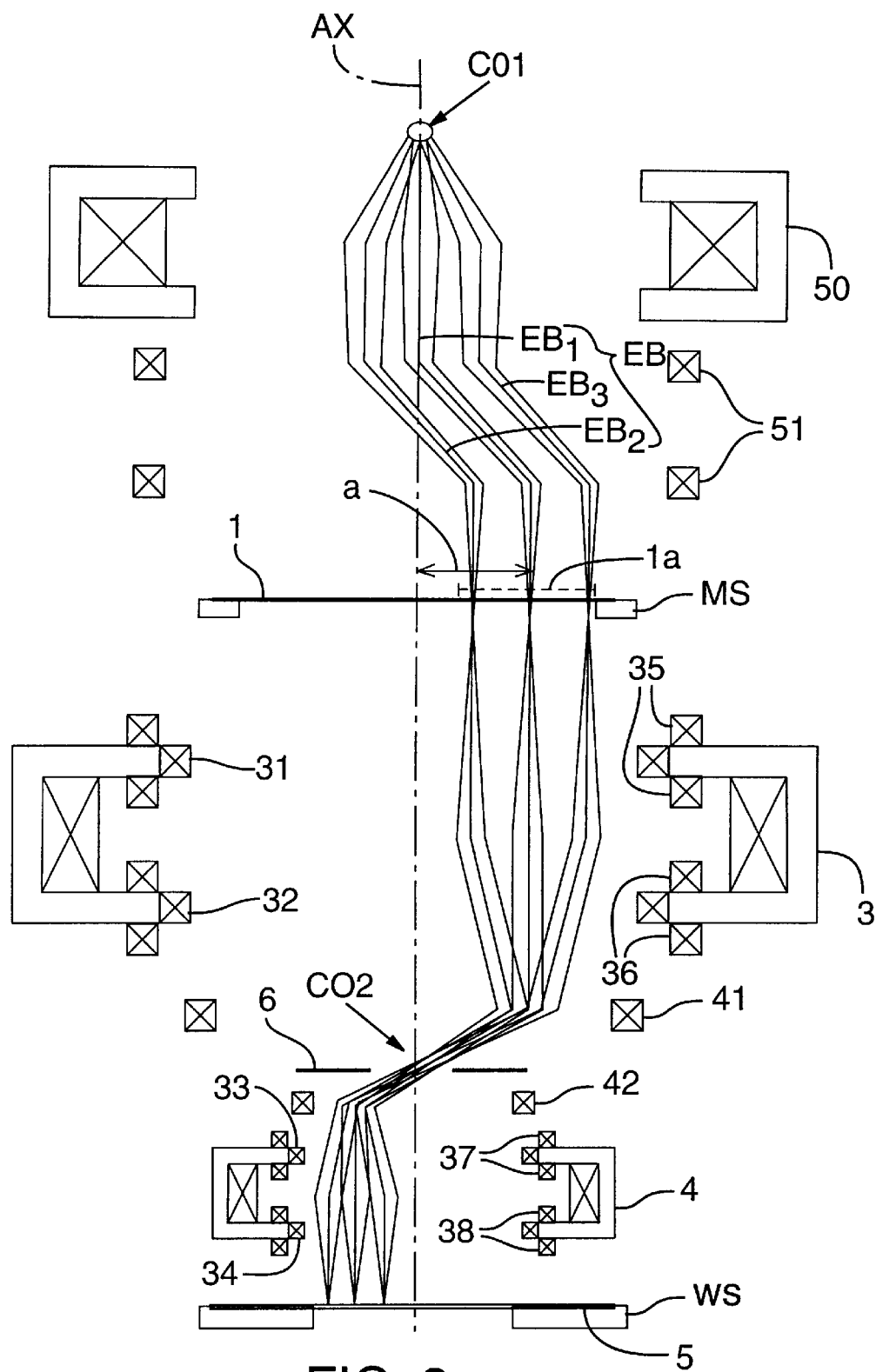
FIG. 3 is a schematic elevational view of a conventional electron-beam projection-transfer apparatus.

FIG. 1 schematically depicts a preferred embodiment of a charged-particle-beam (CPB) exposure apparatus according to the invention. (The FIG. 1 apparatus employs an electron beam as a representative charged particle beam.) Components that are the same as shown in FIG. 3 are denoted using the same reference numerals and are not discussed further.

In FIG. 1, the electron beam EB strikes the subfield 1a of the mask 1 at a normal angle. The pattern image of the subfield 1a is projected onto the photosensitive substrate 5 by the projection lenses 3, 4. The projection lenses 3, 4 collectively comprise a projection-lens system. Deflectors 11, 12, 13, 14, 15, 16 are provided in the projection-lens system in order to generate a deflection field that causes the beam to assume parabolic trajectories as the beam propagates through the projection-lens system, as shown in FIG. 2(a).

The magnitude of the on-axis magnetic field generated by the projection lenses 3, 4 is denoted as B(Z), and the object point, the image point, and the crossover image points are denoted as $z_o$, $z_i$, and $z_{co}$, respectively. The "object-side region" is located between $z_o$ and $z_{co}$, and the "image-side region" is located between $z_{co}$ and $z_i$. The x-direction deflection fields in the object-side and image-side regions are respectively expressed by:

$$W_{mo}\left[-k(z-z_o)B(z) + \frac{1}{2}\left(1 - \frac{1}{2}k(z-z_o)^2\right)\frac{dB(z)}{dz}\right] \quad (4)$$

and $$M \cdot W_{mo}\left[-k(z-z_i)B(z) + \frac{1}{2}\left(1 - \frac{1}{2}k(z-z_i)^2\right)\frac{dB(z)}{dz}\right] \quad (5)$$

The y-direction deflection fields in the object-side and image-side regions are respectively expressed by:

$$-W_{mo} \cdot k\sqrt{2m\phi/e} \quad (6)$$

and $$-M(W_{mo})k\sqrt{2m\phi/e} \quad (7)$$

where e denotes the electric charge of a charged particle in the beam, m is the mass of the charged particle, $\phi$ is the accelerated voltage of the charged particle, $W_{mo}$ is the incremental deflection trajectory at the object point, M is the deflection magnification, and k is a second-order derivative of the deflection trajectory from the object point to the crossover image point when $W_{mo}=1$.

Figure 2B:
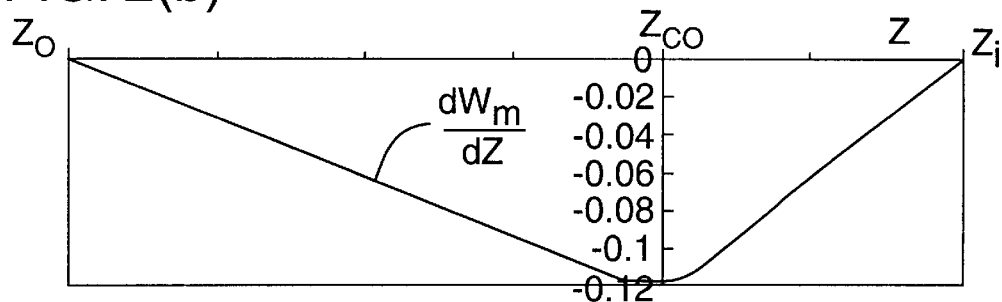
FIG. 2(b) is a plot of the first-order derivative of the deflection trajectory $W_m$ shown in FIG. 2(a).
Figure 2C:
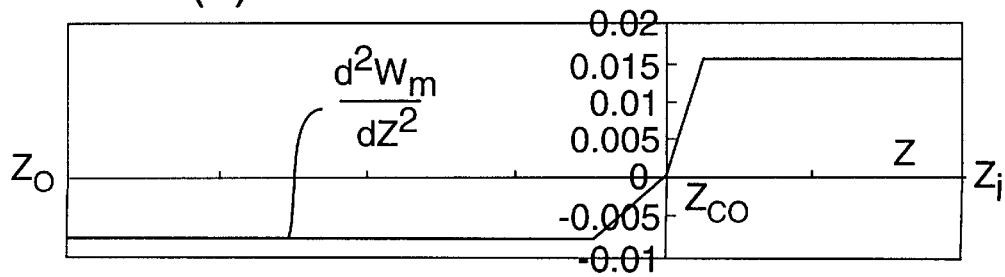
FIG. 2(c) is a plot of the second-order derivative of the deflection trajectory $W_m$ shown in FIG. 2(a).

FIG. 2(a) depicts a representative deflection trajectory $W_m$ from the object point $z_o$ to the image point $z_i$; FIG. 2(b) depicts a first-order derivative $dW_m(z)/dz$ of the deflection trajectory $W_m$; and FIG. 2(c) depicts a second-order derivative $d^2W_m(z)/dz^2$ of the deflection trajectory $W_m$ of FIG. 2(a). In FIGS. 2(a)–2(c), the optical axis AX is aligned with the z-axis. In FIG. 2(a), the deflection magnification is –½. Accordingly, if the beam strikes the object plane ($z=z_o$), offset by 1.0 units from the optical axis AX at a normal angle, and follows a parabolic trajectory $W_m$ passing through the crossover image point ($z=z_{co}$), then the beam is incident to the image point ($z=z_i$) offset by –0.5 units from the optical axis AX at a normal angle. The second-order derivative of this deflection trajectory $W_m$, is substantially constant over most of its range from the object point ($z_o$) to the image point ($z_i$), except for a narrow range near the crossover image point ($z_{co}$), as shown in FIG. 2(c).

Because the deflection trajectory $W_m$ is determined so as to pass through the crossover image point $z_{co}$, the second-order derivative of the deflection trajectory $W_m$ cannot be kept constant near the crossover image point. However, it is preferable that the second-order derivative of $W_m$ be substantially constant over most (at least half) and more preferably over at least three-fourths (¾) of the object-side region extending from the object point $z_o$ toward the crossover image point $z_{co}$. It is also preferable that the second-order derivative of $W_m$ be substantially constant over most (at least half) and more preferably over at least three-fourths (¾) of the image-side region extending from the image point $z_i$ toward the crossover point $z_{co}$.

As shown in FIG. 2(c), the second-order derivatives of the deflection trajectory $W_m$ in the object-side and image-side regions are substantially constant, but have opposite signs. Accordingly, the integral of the function representing the second-order derivative of the deflection trajectory from the object point $z_o$ to the crossover image point $z_{co}$ is effectively canceled by the integral of the function representing the second-order derivative of the deflection trajectory from the crossover image point $z_{co}$ to the image point $z_i$. Thus, the terms in each of Equations (1)–(3) denoted by an integral of the second-order derivative of the deflection trajectory $W_m$ are substantially zero in regions where the second-order derivatives of the deflection trajectory is constant. In addition, because the deflection trajectory $W_m$ is normal to the object plane and the image plane, the first term (i.e., the integral of the first-order derivative of the deflection trajectory $W_m$) of Equation (3) is substantially zero. Consequently, deflection coma, hybrid astigmatism, and hybrid field curvature are all reduced substantially to zero in such regions. Thus, an electron-beam optical system exhibiting little aberration is achieved.

Therefore, if a CPB projection-lens system satisfies the SMD condition, and if the deflection system also exhibits a symmetry characteristic of an SMD system, then deflection chromatic aberration, deflection distortion, and hybrid distortion are reduced substantially to zero. Other aberrations such as deflection coma, hybrid astigmatism, and hybrid field curvature can be greatly reduced by establishing a deflection trajectory according to the invention.

The present invention can also be applied to a CPB optical system in which the projection-lens system is not of an SMD type. If the deflection chromatic aberration, the deflection distortion, and the hybrid distortion exhibited by such non-SMD optical systems are insignificant compared to the overall aberrations, then the aberrations exhibited by such an optical system can be effectively reduced by appropriately establishing a deflection trajectory according to the invention. This is because the deflection coma, the hybrid astigmatism, and the hybrid field curvature are all greatly reduced by such a deflection trajectory.

The deflectors 11–16 collectively comprise a preferred embodiment of a deflection system for generating a deflection trajectory of the charged particle beam. The trajectory exhibits a second-order derivative that is substantially constant over most of each of the object-side and image-side regions.

In deflection coma, hybrid astigmatism, and hybrid field curvature as expressed by Equations (1)–(3), the integral of the second-order derivative of the deflection trajectory from the object point to the crossover image point is canceled by the integral from the crossover image point to the image point. As a result, the entire aberration integral can be greatly reduced. This effect can be achieved even if the deflection distance from the optical axis is increased. In other words, even if the width of each subfield 1a is increased, and even if the subfield 1a is located remotely from the optical axis of the system, the pattern of the subfield 1a is correctly scanned by the electron beam and accurately projected onto the photosensitive substrate 5.

Working Examples

These working examples represent a comparison of electron-beam optical systems according to the invention (configured as shown in FIG. 1) with a conventional electron-beam optical system (configured as shown in FIG. 3). With both types of systems, various performance and aberrational determinations were made, as set forth in Table 1, below. The conventional apparatus (designated apparatus "C" in the Table 1) imparted a linear trajectory to the electron beam, whereas the apparatus according to the invention (designated apparatus "101"–"104" in Table 1) imparted a parabolic trajectory to the electron beam.

In Table 1 the column labeled "$z_i$" lists data concerning respective coordinates along the optical axis of the image point. With respect to apparatus 101–104, $z_i$ is the axial location at which the second-order derivative $d^2W_m(z)/dz^2$ changes, as shown in FIG. 1, and is calculated for each of the four apparatus. With respect to apparatus C, $z_i$ is the deflection position of deflector 41, as shown in FIG. 3, corresponding to the position $z_i$ in FIG. 1. The units of $z_i$ are mm.

Table 1 also lists data concerning the following aberrations: deflection coma (see column labeled "M COMA"), hybrid field curvature (see column labeled "HB F.C."), hybrid astigmatism (see column labeled "HB ASTI"), hybrid distortion (see column labeled "HB DIST"), deflection chromatic aberration (see column labeled "M CHRO"), and blur (see column labeled "BLUR"). The units for each aberration are $\mu$m. Table 1 lists only those aberrations that are relatively large.

In each apparatus C and 101–104, the acceleration voltage for the electron beam was 100 kV +/−6 V; the deflection distance at the object plane was 20 mm (5 mm at the image plane); the image height at the image plane was 250 $\mu$m; and the aperture angle of the beam at the image plane was 6 mrad. The dimension between the object plane ($z_o$) and the image plane ($z_i$) in the optical system was 570 mm, the dimension between the object plane and the crossover image plane ($z_{co}$) was 456 mm, and the dimension between the image plane and the crossover plane was 114 mm. The deflection field fulfilled the SMD condition, and each system was fully is symmetrical with a demagnification ratio of 4:1. In each example, the respective system was configured such that the landing angle of the beam at the object plane and at the image plane was substantially perpendicular. In addition, for accurate comparison of apparatus 101–104 to the conventional apparatus C, the data for apparatus C only includes data obtained at $z_i$=−142.5 mm.

TABLE 1

| App. | $z_i$ | M COMA | HB F.C. | HB ASTI | HB DIST | M CHRO | BLUR |
|---|---|---|---|---|---|---|---|
| 101 | −142.5 | 0.0052 | 0.0377 | 0.0465 | 0.0078 | 0.0044 | 0.0674 |
| 102 | −171 | 0.0090 | 0.0379 | 0.0466 | 0.0078 | 0.0043 | 0.0680 |
| 103 | −228 | 0.0172 | 0.0402 | 0.0474 | 0.0078 | 0.0041 | 0.0713 |
| 104 | −342 | 0.0248 | 0.0503 | 0.0502 | 0.0077 | 0.0038 | 0.0812 |
| C | −142.5 | 0.9822 | 0.9065 | 0.1902 | 0.1196 | 0.0219 | 1.3505 |

Comparing the data for apparatus 101–104 with the data for apparatus C, it can be seen that the parabolic trajectory obtained in apparatus 101–104 yielded much smaller aberrations of all listed types. Also, with apparatus 101–104, image blurring was about an order of magnitude less than obtained with the apparatus C. Furthermore, as $z_i$ was moved further away from the crossover image point (i.e., as $z_i$ gets smaller), hybrid distortion and deflection chromatic aberrations were essentially unchanged or decreased slightly (as indicated by the data for apparatus 2–4 ). But, other aberrations, especially deflection coma, and image blur were increased.

Whereas the invention has been described in connection with a preferred embodiment, it will be understood that the invention is not limited to that embodiment. On the contrary, the invention is intended to encompass all alternatives, modifications, and equivalents as may be included within the spirit and scope of the invention as defined by the appended claims.

What is claimed is:

1. A charged-particle-beam optical system for projecting an image of an object onto a sample, the system comprising:

(a) first and second projection lenses for projecting an image of the object onto the sample using a charged particle beam propagating along a trajectory through the first and second projection lenses, the object being situated at an object position, and the sample being situated at an image position; and (b) a deflector system configured and situated so as to deflect the trajectory of the charged particle beam such that a second-order derivative of the deflected trajectory is substantially constant through most of an object-side region extending from the object position to a crossover image point located between the object position and the image position, and substantially constant through most of an image-side region extending from the crossover image point to the image position.

2. The optical system of claim 1, wherein the deflector system generates a deflection field satisfying an Symmetric Magnetic Doublet SMD condition.

3. The optical system of claim 1, wherein:
the object position, crossover image point, and image position are separated from each other along a z direction that is orthogonal to orthogonal x and y directions, the z direction being parallel to an optical axis of the optical system; and
the deflector system generates x- and y-direction deflection fields, in the object-side region, that are respectively expressed by $$W_{mo}\left[-k(z-z_o)B(z) + \frac{1}{2}\left(1 - \frac{1}{2}k(z-z_o)^2\right)\frac{dB(z)}{dz}\right]$$

and $$-W_{mo} \cdot k\sqrt{2m\phi/e}$$

and generates x- and y-direction deflection fields, in the image-side region, that are respectively expressed by $$M \cdot W_{mo}\left[-k(z-z_i)B(z) + \frac{1}{2}\left(1 - \frac{1}{2}k(z-z_i)^2\right)\frac{dB(z)}{dz}\right]$$

and $$-M(W_{mo})k\sqrt{2m\phi/e}$$

wherein $z_o$, $z_i$, and $z_{co}$ are z coordinates of the object point, the image point, and the crossover image point, respectively; e is an electric charge of a charged particle in the charged particle beam; m is a mass of the charged particle; $W_{mo}$ is a magnitude of deflection from the optical axis at the object point; $\phi$ is an acceleration voltage of the charged particle; B(Z) is an on-axis magnetic field distribution generated by the first and second projection lenses; M is a deflection magnification of the image relative to the object as projected by the projection lenses; and k is a constant.

4. The optical system of claim 3, wherein the deflector system generates a deflection field satisfying an Symmetric Magnetic Doublet (SMD) condition.

5. The optical system of claim 1, wherein the second-order derivative of the deflected trajectory through the object-side region is opposite in sign to the second-order derivative of the deflected trajectory through the image-side region.

6. The optical system of claim 5, wherein the sign changes at the crossover image point.

7. The optical system of claim 1, wherein the beam follows a first parabolic trajectory from the object position to the crossover image point and a second parabolic trajectory from the crossover image point to the image position.

8. The optical system of claim 7, wherein the second-order derivative of the deflected trajectory through the object-side region is opposite in sign to the second-order derivative of the deflected trajectory through the image-side region.

9. The optical system of claim 8, wherein the sign changes at the crossover image point.

10. The optical system of claim 1, wherein the beam follows at least one parabolic trajectory through the first and second projection lenses.

11. The optical system of claim 10, wherein the second-order derivative of the deflected trajectory through the object-side region is opposite in sign to the second-order derivative of the deflected trajectory through the image-side region.

12. The optical system of claim 11, wherein the sign changes at the crossover image point.

13. The optical system of claim 1, wherein the beam follows a parabolic trajectory through the crossover image point.

14. The optical system of claim 13, wherein the second-order derivative of the deflected trajectory through the object-side region is opposite in sign to the second-order derivative of the deflected trajectory through the image-side region.

15. The optical system of claim 14, wherein the sign changes at the crossover image point.

16. The optical system of claim 1, wherein the second-order derivative is constant over at least three-fourths of the distance through each of the object-side region and the image-side region.

17. The optical system of claim 16, wherein the second-order derivative of the deflected trajectory through the object-side region is opposite in sign to the second-order derivative of the deflected trajectory through the image-side region.

18. The optical system of claim 17, wherein the sign changes at the crossover image point.

19. The optical system of claim 16, wherein an integral of a function representing the second-order derivative of the deflection trajectory from the object point to the crossover image point is effectively cancelled by an integral of a function representing the second-order derivative of the deflection trajectory from the crossover image point to the image point.

20. The optical system of claim 1, wherein the deflection trajectory is normal to an object plane at the image position and an image plane at the image position.

21. A charged-particle-beam projection-exposure apparatus, comprising:
(a) an illumination lens for directing a charged particle beam from a source to a mask;
(b) first and second projection lenses situated downstream of the mask for projecting an image of a region of the mask illuminated by the charged particle beam onto a substrate using the charged particle beam propagating along a trajectory through the first and second projection lenses, the mask being situated at an object position, and the substrate being situated at an image position; and
(c) a deflector system configured and situated so as to deflect the trajectory of the charged particle beam such that a second-order derivative of the deflected trajectory is substantially constant through most of an object-side region extending from the object position to a crossover image point located between the object position and the image position, and substantially constant through most of an image-side region extending from the crossover image point to the image position.

22. The apparatus of claim 21, wherein:
the object position, crossover image point, and image position are separated from each other along a z direction that is orthogonal to orthogonal x and y directions, the z direction being parallel to an optical axis of the optical system; and
the deflector system generates x- and y-direction deflection fields, in the object-side region, that are respectively expressed by $$W_{mo}\left[-k(z-z_o)B(z) + \frac{1}{2}\left(1 - \frac{1}{2}k(z-z_o)^2\right)\frac{dB(z)}{dz}\right]$$

and $$-W_{mo} \cdot k\sqrt{2m\phi/e}$$

and generates x- and y-direction deflection fields, in the image-side region, that are respectively expressed by $$M \cdot W_{mo}\left[-k(z-z_i)B(z) + \frac{1}{2}\left(1 - \frac{1}{2}k(z-z_i)^2\right)\frac{dB(z)}{dz}\right]$$

and $$-M(W_{mo})k\sqrt{2m\phi/e}$$

wherein $z_o$, $zi$, and $z_{co}$ are z coordinates of the object point, the image point, and the crossover image point, respectively; e is an electric charge of a charged particle in the charged particle beam; m is a mass of the charged particle; $W_{mo}$ is a magnitude of deflection from the optical axis at the object point; φ is an acceleration voltage of the charged particle; B(Z) is an on-axis magnetic field distribution generated by the first and second projection lenses; M is a deflection magnification of the image relative to the object as projected by the projection lenses; and k is a constant.

23. The apparatus of claim 22, wherein the beam follows a first parabolic trajectory from the object position to the crossover image point and a second parabolic trajectory from the crossover image point to the image position.

24. The apparatus of claim 23, wherein the second-order derivative of the deflected trajectory over the object-side region is opposite in sign to the second-order derivative of the deflected trajectory over the image-side region.

25. The apparatus of claim 21, wherein the charged particle beam is an electron beam.

26. A method for projecting an image of an object onto a sample, comprising:
(a) providing a charged particle beam;
(b) illuminating a region on the object, situated at an object position, using the charged particle beam;
(c) passing the beam, transmitted through the illuminated region, in a trajectory through first and second projection lenses to a sample situated at an image position;
(d) as the charged particle beam passes through the first and second projection lenses, deflecting the charged beam such that the trajectory of the charged particle beam through most of an object-side region extending from the object position to a crossover image position has a substantially constant second-order derivative, and the trajectory of the charged particle beam through most of an image-side region extending from the crossover image position to the image position has a substantially constant second-order derivative.

27. The method of claim 26, wherein the second-order derivative of the trajectory through the object-side region is opposite in sign to the second-order derivative of the trajectory through the image-side region.

28. The method of claim 27, wherein the sign changes at the crossover image point.

29. The method of claim 26, wherein the beam follows a first parabolic trajectory from the object position to the crossover image point and a second parabolic trajectory from the crossover image point to the image position.

* * * * *

UNITED STATES PATENT AND TRADEMARK OFFICE
CERTIFICATE OF CORRECTION

PATENT NO. : 6,066,855

DATED : May 23, 2000

INVENTOR(S) : Hiroyasu Simizu

It is certified that error appears in the above-identified patent and that said Letters Patent is hereby corrected as shown below:

In Column 6, line 15, "$H_{as} = \int_{z_i}^{z_o} \left(C_{as} \cdot \frac{d^2 W_m(z)}{dz^2} dz\right.$" should be -- $H_{as} = \int_{z_i}^{z_o} \left(C_{as} \cdot \frac{d^2 W_m(z)}{dz^2} dz\right)$ --.

<u>In the Claims</u>:

In Column 12, line 45, "object plane at the image position" should read --object plane at the object position--.

In Column 13, line 31, "zi," should read -- $z_i$ --.

Signed and Sealed this

Eighth Day of May, 2001

Attest:

NICHOLAS P. GODICI

Attesting Officer

Acting Director of the United States Patent and Trademark Office